United States Patent
Kanda et al.

(10) Patent No.: US 11,464,151 B2
(45) Date of Patent: Oct. 4, 2022

(54) ELECTRONIC COMPONENT MOUNTING MACHINE

(71) Applicant: FUJI CORPORATION, Chiryu (JP)

(72) Inventors: Tomohisa Kanda, Anjo (JP); Hidetoshi Kawai, Anjo (JP)

(73) Assignee: FUJI CORPORATION, Chiryu (JP)

( * ) Notice: Subject to any disclaimer, the term of this patent is extended or adjusted under 35 U.S.C. 154(b) by 238 days.

(21) Appl. No.: 16/614,890

(22) PCT Filed: Jun. 20, 2017

(86) PCT No.: PCT/JP2017/022649
§ 371 (c)(1),
(2) Date: Nov. 19, 2019

(87) PCT Pub. No.: WO2018/235155
PCT Pub. Date: Dec. 27, 2018

(65) Prior Publication Data
US 2020/0113095 A1    Apr. 9, 2020

(51) Int. Cl.
*H05K 13/08* (2006.01)
*H05K 13/00* (2006.01)
*H05K 13/04* (2006.01)

(52) U.S. Cl.
CPC ..... *H05K 13/0882* (2018.08); *H05K 13/0069* (2013.01); *H05K 13/0404* (2013.01)

(58) Field of Classification Search
CPC ........... H05K 13/0882; H05K 13/0069; H05K 13/0404
See application file for complete search history.

(56) References Cited

U.S. PATENT DOCUMENTS 5,092,510 A * 3/1992 Anstrom ............ H05K 13/0465
228/106
5,330,168 A * 7/1994 Enomoto .................. B25B 5/16
269/329

(Continued)

FOREIGN PATENT DOCUMENTS

CN    1669379 A  *  9/2005  ......... H05K 13/0439
CN  101048282 A     10/2007

(Continued)

OTHER PUBLICATIONS

International Search Report dated Sep. 5, 2017 in PCT/JP2017/022649 filed on Jun. 20, 2017.

*Primary Examiner* — Jeffrey T Carley
(74) *Attorney, Agent, or Firm* — Oblon, McClelland, Maier & Neustadt, L.L.P.

(57) ABSTRACT

An electronic component mounting machine including a board clamp device configured to clamp a circuit board conveyed by a conveyor by sandwiching side edge sections of the circuit board between a clamp member from below and a conveyor rail from above by raising the clamp member, the electronic component mounting machine being configured to mount electronic components on the circuit board clamped by the board clamp device; and a control device configured to control a clamping force that is a sandwiching force on the side edge sections of the circuit board sandwiched between the clamp member and the conveyor rail of the board clamp device. The control device is configured to acquire board information including at least a weight of the circuit board and to control the clamping force of the board clamp device based on the acquired board information.

11 Claims, 3 Drawing Sheets

During board unclamping

During board clamping

(56) References Cited

U.S. PATENT DOCUMENTS

| | | | | |
|---|---|---|---|---|
| 6,439,826 B1 * | 8/2002 | Jordan | ................ | B25J 13/082 |
| | | | | 294/907 |
| 7,121,199 B2 * | 10/2006 | Perault | ................ | B41F 15/26 |
| | | | | 101/126 |
| 8,505,178 B2 * | 8/2013 | Farlow | ............... | H05K 13/0069 |
| | | | | 29/559 |
| 8,755,929 B2 * | 6/2014 | McKernan | ............. | B66F 9/183 |
| | | | | 700/213 |
| 2001/0039464 A1 * | 11/2001 | Hackauf | ................ | B66F 9/184 |
| | | | | 700/213 |
| 2009/0281655 A1 * | 11/2009 | McKernan | ............... | B66F 9/22 |
| | | | | 700/225 |
| 2016/0073511 A1 * | 3/2016 | Watanabe | .......... | H05K 13/0404 |
| | | | | 29/739 |

FOREIGN PATENT DOCUMENTS

| | | | | |
|---|---|---|---|---|
| EP | 2840597 B1 * | 7/2020 | ......... | B25J 17/0208 |
| JP | 2004246859 A * | 9/2004 | ......... | H05K 13/0882 |
| JP | 2012253085 A * | 12/2012 | | |
| JP | 2014-212247 A | 11/2014 | | |
| JP | 2017163084 A * | 9/2017 | | |
| WO | WO-9734822 A1 * | 9/1997 | ......... | H05K 13/0069 |

\* cited by examiner

During board unclamping

During board clamping

ELECTRONIC COMPONENT MOUNTING MACHINE

TECHNICAL FIELD

The present specification discloses technology relating to an electronic component mounting machine provided with a board clamp device configured to pinch and clamp from above and below side edge sections of a circuit board conveyed by a conveyor.

BACKGROUND ART

In an electronic component mounting machine for mounting electronic components on a circuit board, as described in patent literature 1 (JP-A-2014-212247), a circuit board conveyed by a conveyor is fixed by being clamped at edge sections of the circuit board from below by raising a clamp member and from above by a conveyor rail, and electronic components are then mounted on the fixed circuit board.

CITATION LIST

Patent Literature

Patent Literature 1: JP-A-2014-212247

BRIEF SUMMARY

Technical Problem

Circuit boards of various weights are clamped in an electronic component mounting machine. Therefore, a board clamp device may be configured assuming the heaviest circuit board of the various weights of circuit boards to be clamped, with the circuit board being clamped with a constant maximum clamping force such that even the heaviest circuit board can be clamped stably. Thus, for the majority of circuit boards, which are lighter than the heaviest expected circuit board, the clamping force is too great, and as a result, the circuit board may crack or be damaged by the clamping action, depending on the material of the circuit board.

In addition, with a board clamp device, there is a relationship such that the power consumption of the motor serving as a drive source increases as the clamping force increases, however, for a large number of circuit boards lighter than the heaviest assumed circuit board, similar to when the heaviest circuit board is clamped, clamping is performed always with the maximum clamping force, which consumes more power than necessary, causing increased power consumption of the electronic component mounting machine.

Moreover, when clamping a large number of circuit boards lighter than the heaviest assumed circuit board, because the maximum clamping force is applied to the conveyor every time the clamping operation is performed, the mechanical strength and durability of the conveyor must be sufficiently increased so that the conveyor can withstand the large repeated load due to the clamping operation, which means that manufacturing costs are correspondingly increased.

Solution to Problem

To solve the above problems, provided is an electronic component mounting machine including: a board clamp device configured to clamp a circuit board conveyed by a conveyor by sandwiching side edge sections of the circuit board between a clamp member from below and a conveyor rail from above by raising the clamp member, the electronic component mounting machine being configured to mount electronic components on the circuit board clamped by the board clamp device; and a control device configured to control a clamping force that is a sandwiching force on the side edge sections of the circuit board sandwiched between the clamp member and the conveyor rail of the board clamp device, the control device being configured to acquire board information including at least a weight of the circuit board and to control the clamping force of the board clamp device based on the acquired board information.

In this configuration, since the board information including at least the weight of the circuit board is acquired and the clamping force of the board clamp device is controlled based on the board information, for example, when the weight of the circuit board is light, the clamping force of the board clamp device is reduced in accordance with the light weight, and when the weight of the circuit board is heavy, the clamping force of the board clamp device is increased in accordance with the heavy weight. As a result, when a large number of circuit boards lighter than the heaviest assumed circuit board are clamped, the clamping force of the board clamp device can be reduced in accordance with the weight of the circuit boards, the circuit boards can be prevented from being cracked or damaged by the clamping operation, the power consumed by the drive source of the board clamp device can be reduced, and energy saving can be realized. Moreover, when a large number of circuit boards lighter than the heaviest assumed circuit board are clamped, the clamping force acting on the conveyor can be reduced, such that the quantity and duration of the maximum clamping force acting on the conveyor can be greatly reduced, thereby relaxing the design criteria for the mechanical strength and durability of the conveyor, thus reducing manufacturing costs.

In addition, when the electronic components are mounted on the circuit board in order by multiple of the electronic component mounting machines that configure a production line, the control device of each electronic component mounting machine except for the electronic component mounting machine at the head (furthest upstream) of each of the multiple electronic component mounting machines may acquire information of the electronic components already mounted on the circuit board loaded from the electronic component mounting machine at an upstream side from an upstream side electronic component mounting machine, a production line management computer, or the like, and add a total weight of the mounted electronic components to the weight of the circuit board to control the clamping force of the electronic component. In this way, even if the total weight of the circuit board to be clamped becomes heavier to some extent due to the total weight of the mounted electronic component, the circuit board can be clamped with an appropriate clamping force depending on the combined weight of the circuit board and the mounted electronic components.

Also, as a parameter for controlling the clamping force, the board information is not limited to the weight of the circuit board, or the total weight of the already mounted electronic components, but may include the material of the circuit board. For example, control may be performed such that the clamping force is smaller as the material of the circuit board is more susceptible to cracking or damage. Accordingly, even if the material of the circuit board to be clamped is susceptible to cracking or damage, cracking or damage of the circuit board due to the clamping operation can be prevented as much as possible.

There are several methods for the control device of the electronic component mounting machine to acquire the board information, for example, the board information may be registered in a production program executed by the electronic component mounting machine, and the control device of the electronic component mounting machine may acquire the board information from the production program.

Alternatively, the circuit board may be provided with a board information recording section in which board information is recorded or stored, a board information reading section configured to read the board information from the board information recording section of the circuit board, and the control device of the electronic component mounting machine may acquire circuit board information read by the board information reading section from the board information recording section of the circuit board. In this case, the board information reading section may be installed in each of the multiple electronic component mounting machines constituting the production line, or may be installed outside the electronic component mounting machine, for example, at the furthest upstream of the production line, and the board information reading section further upstream in the production line may read the board information of the circuit board loaded to the production line, and that board information may be transmitted to each electronic component mounting machine of the production line. Alternatively, the board information of the circuit board to be manufactured may be transmitted from a production line management computer to the control device of the electronic component mounting machine.

Further, the control device of the electronic component mounting machine may be configured to control the clamping force to a clamping force set based on the board information from the beginning of the clamping operation of the board clamp device, or may perform the clamping operation with a predetermined clamping force larger than the clamping force set based on the board information until the clamping operation of the board clamp device is completed, and may switch the clamping force of the board clamp device to the clamping force set based on the board information after the clamping operation is completed to maintain the clamping state. In this manner, if the clamping operation is started with a relatively large clamping force from the beginning of the clamping operation, the clamping operation rate at which the side edge sections of the circuit board are lifted by the clamp member from below can be increased, and productivity can be improved.

Note that, as a method of mounting electronic components on the circuit board, in addition to a method of soldering or wire bonding the terminals of the electronic component to the lands on the surface of the circuit board, there is insertion or press-fit mounting (also called through-hole mounting) in which terminals such as the leads of the electronic component are inserted or pressed into holes of the circuit board so as to mount the electronic component on the circuit board. With such insertion or press-fit mounting, when a terminal such as a lead of an electronic component is inserted or pressed into a hole of a circuit board, the load of the insertion or pressing acts as a load for pushing down the circuit board, therefore, if the load of the insertion or pressing increases, a clamping force for fixing the circuit board may be insufficient and the circuit board may be displaced.

As a countermeasure, the control device of the electronic component mounting machine may control the board clamp device clamping force by considering, in addition to the board data, the load when a terminal or protrusion of the electronic component is inserted or pressed into the hole of the circuit board. This makes it possible to clamp the circuit board with an appropriate clamping force corresponding to the combined weight of the weight of the circuit board and the load of the insertion or pressing even when the load of the insertion or pressing is applied to the circuit board during insertion or press-fit mounting, thereby preventing positional deviation of the circuit board due to insertion or press-fit mounting.

Note that, the information of the clamping force controlled by the control device may be registered as traceability information in a production management database in association with identification information of the circuit board. In this way, if any defect (for example, cracking, or damage to the circuit board, deviation of the component mounting position, and the like) occurs in a produced electronic component mounting board, traceability information regarding the electronic component mounting board in which the defect occurred can be read from the production management database, and the clamping force when the electronic component mounting board was clamped can be investigated, and it can be checked whether the cause of the defect was excessive or insufficient clamping force.

DESCRIPTION OF EMBODIMENTS

An embodiment is described below.

Figure 1:
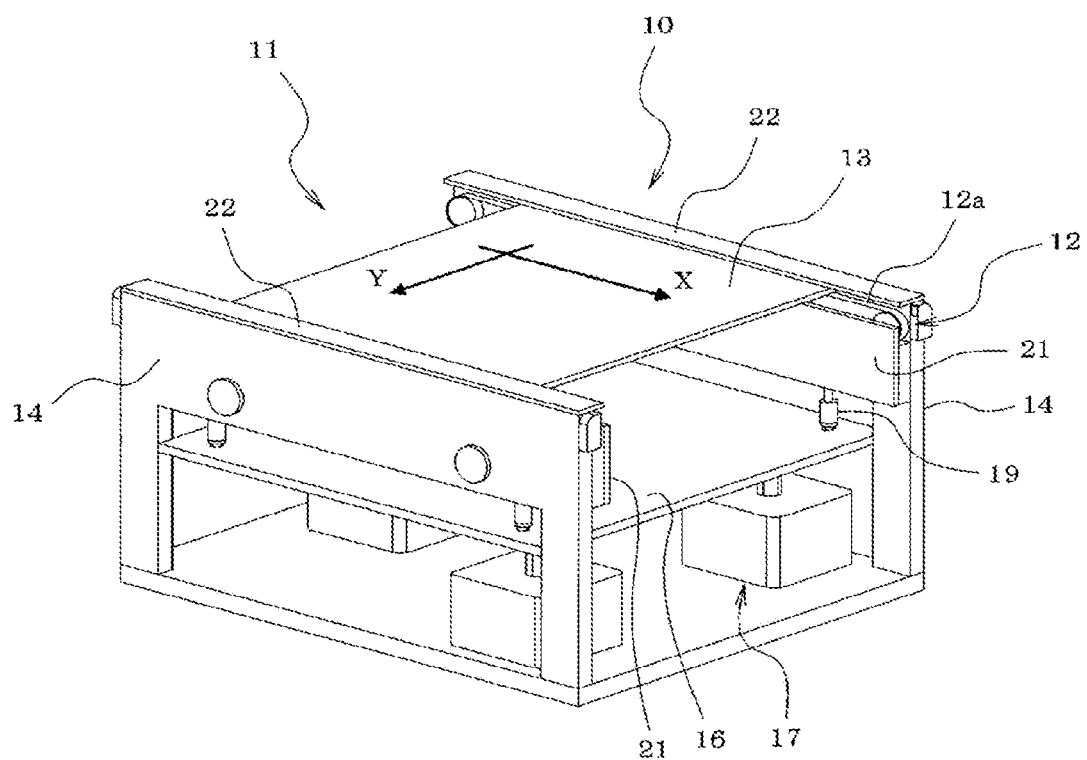
FIG. 1 is a perspective view showing a component mounting station of an electronic component mounting machine of an embodiment.

First, the configuration of component mounting station 11 of the electronic component mounting machine will be described with reference to FIG. 1.

Component mounting station 11 is a station at which a circuit board 13 conveyed in the X direction by conveyor 12 is clamped by board clamp device 10, and electronic components are mounted on the circuit board 13 by a mounting head (not shown) of an electronic component mounting machine. Conveyor 12 is provided with two conveyor belts 12a so as to carry the left and right side edge sections of circuit board 13, and by moving side frame 14 holding one conveyor belt 12a in the width direction (Y direction) in accordance with the width of the circuit board 13, the width of conveyor 12 (the distance between the two conveyor belts 12a) can be adjusted in accordance with the width of circuit board 13.

Figure 2:
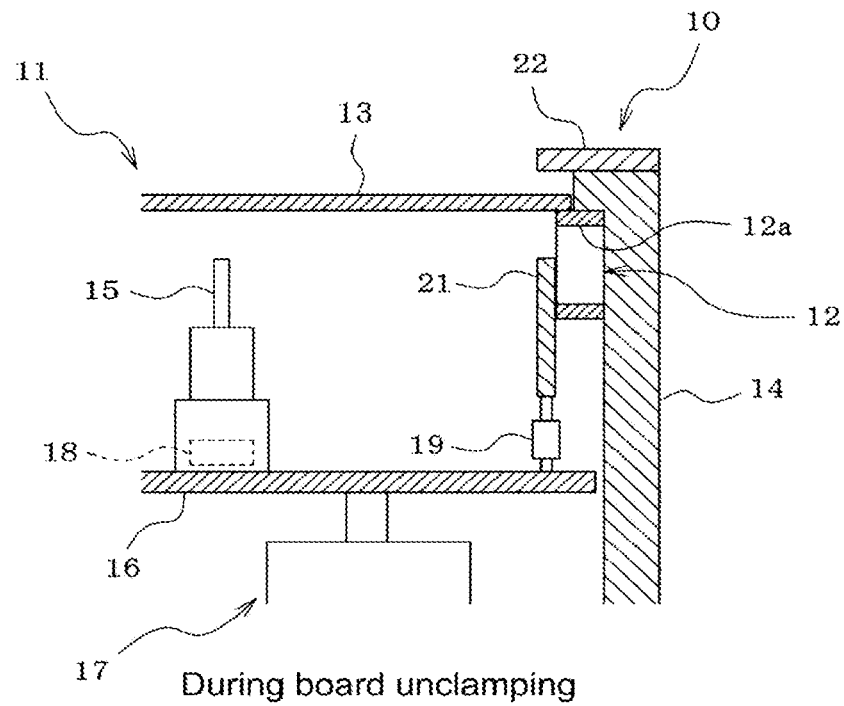
FIG. 2 is a vertical cross-sectional view showing a board in an unclamped state.
Figure 3:
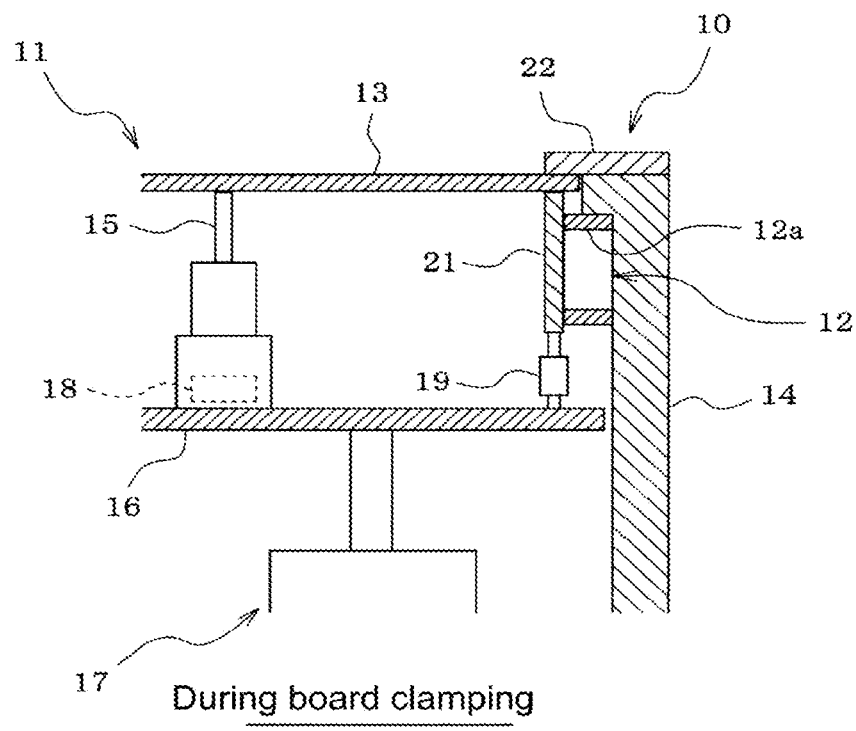
FIG. 3 is a vertical cross-sectional view of the board in a clamped state.

Backup plate 16 on which backup pins 15 are loaded is horizontally provided in component mounting station 11 (refer to FIGS. 2 and 3). Backup plate 16 is made of magnetic material such as steel, and is configured such that backup pins 15 can be held at any position on backup plate 16 by magnet 18 provided on a lower section of the backup pin 15 (see FIGS. 2 and 3). Backup plate 16 is configured to be moved up and down by raising and lowering device 17, and the lower limit position of lowering operation is the board unclamping position (board clamp release position) shown in FIG. 2, and the upper limit position of raising operation is the board clamp position shown in FIG. 3.

On both sides of backup plate 16, plate-like clamp member 21 is attached via support member 19 so as to be positioned on both widthwise sides (inside each conveyor belt 12a) of conveyor 12. A plate-like conveyor rail 22 is attached to the upper end of each side frame 14 so as to project inwardly in a flange shape.

As shown in FIG. 2, in a state with backup plate 16 lowered to the board unclamping position, the upper ends of backup pins 15 on backup plate 16 are at a position lower than the lower surface of circuit board 13 on conveyor 12, and, in a case in which a pre-mounted component has been mounted on the lower surface of circuit board 13 on conveyor 12, the upper ends of backup pins 15 on backup plate 16 are at a position lower than the lower end of the pre-mounted component on the lower surface of circuit board 13, such that the pre-mounted component on the lower surface of the circuit board 13 does not interfere with backup pins 15 when circuit board 13 is loaded.

On the other hand, as shown in FIG. 3, in a state with backup plate 16 raised to the board clamping position, the upper ends of backup pins 15 on backup plate 16 rise to the same height as the conveying surface (the upper surface of the conveyor belt 12a) of conveyor 12, and the upper ends of backup pins 15 abut against the lower surface of circuit board 13 on conveyor 12 to support the circuit board 13 from below and prevent the circuit board 13 from warping (bending downward). When backup plate 16 is raised to the board clamping position, clamp member 21 rises integrally with backup plate 16, and the left and right side edges of the circuit board 13 are pushed up from below by clamp member 21 and sandwiched between clamp member 21 and conveyor rail 22, which is positioned above, so as to be clamped. The raising and lowering operation (clamping and unclamping operation) of raising and lowering device 17 serving as the drive source of board clamp device 10 configured as described above is controlled by control device 31 of the electronic component mounting machine.

Feeders 32 such as tape feeders, tray feeders, or the like for supplying electronic components (see FIG. 4) are arranged to the side of component mounting station 11. The electronic component mounting machine is provided with a mounting head (not shown) for holding electronic components supplied from feeder 32 by suction or the like, and a head moving device 33 (see FIG. 4) for moving the mounting head. Further, the electronic component mounting machine is also provided with mark imaging camera 34 (see FIG. 4) that is moved integrally with the mounting head by head moving device 33 to image reference marks of circuit board 13 from above, and component imaging camera 35 (see FIG. 4) that images the electronic component held by the mounting head from below.

Figure 4:
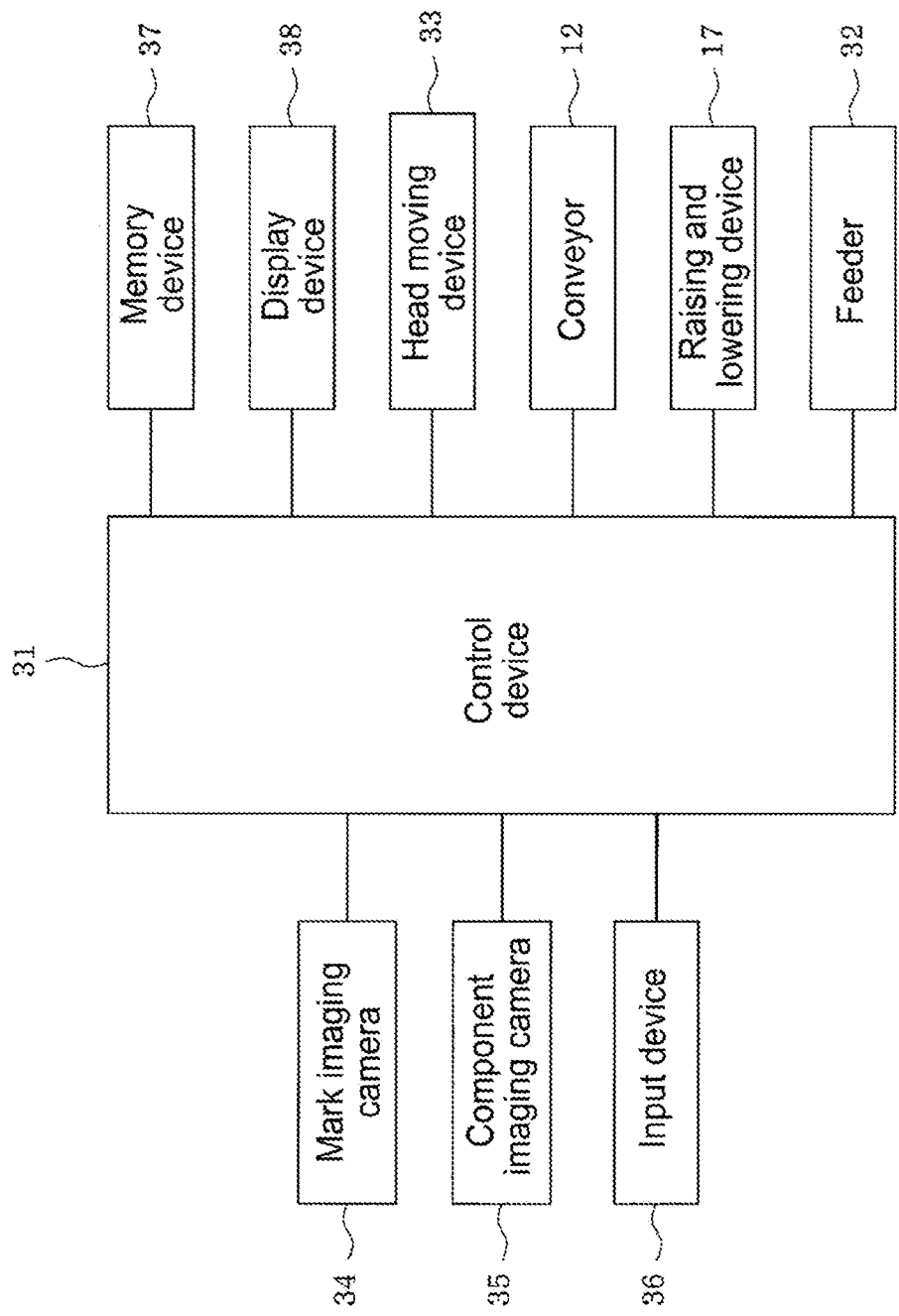
FIG. 4 is a block diagram showing the configuration of control items of the electronic component mounting machine.

As shown in FIG. 4, input device 36 such as a keyboard, mouse, touchscreen panel; memory device 37 such as a hard disk, RAM, or ROM for storing production programs and various data; and display device 38 such as a liquid crystal display or a cathode ray tube (CRT) are connected to control device 31 of the electronic component mounting machine.

Control device 31 of the electronic component mounting machine is mainly configured by a computer, and controls operation of mounting electronic components on circuit board 13. Specifically, control device 31 of the electronic component mounting machine performs control of operation to capture an image of reference marks of circuit board 13, which is loaded to a predetermined operation position by conveyor 12 and clamped by board clamping device 10, from above with mark imaging camera 34, process the image to recognize the reference marks, measure the respective component mounting positions of the circuit board 13 with reference to the position of the reference marks, and then move the mounting head in order to the following positions: component pickup position→component imaging position→component mounting position, during which an electronic component supplied from feeder 32 is picked up by the head, the electronic component is imaged by component imaging camera 35, the captured image is processed to measure the pickup position (X, Y) and the angle θ of the electronic component, the deviation of the pickup position (X, Y) and the angle θ of the electronic component are corrected, and the electronic component is mounted on the circuit board 13.

Further, control device 31 of the electronic component mounting machine also: functions as a control device for controlling a clamping force that is a force for sandwiching the side edge sections of circuit board 13 between clamp member 21 and conveyor rail 22 of board clamp device 10; acquires board information including at least the weight of the circuit board 13; and controls the clamping force of control device 31 based on the board information. Specifically, control device 31 of the electronic component mounting machine performs control such that the clamping force of board clamp device 10 becomes smaller as the weight of the circuit board 13 becomes lighter. To this end, the clamping force of board clamp device 10 is controlled by controlling the torque of the driving motor of raising and lowering device 17, which is the drive source of board clamp device 10, according to the weight of the circuit board 13. The clamping force is calculated in advance by setting the relationship between the weight of the circuit board 13 and the clamping force in a mathematical expression or table using the weight of the circuit board 13 as a parameter (variable) and storing it in memory device 37, and by using this mathematical expression or table, calculating the clamping force corresponding to the weight of the circuit board 13.

Further, in a production line where multiple of the electronic component mounting machines are arranged along the conveyance path along which circuit board 13 is conveyed and, the electronic components being mounted on the circuit board 13 in order by the multiple electronic component mounting machines, control device 31 of each electronic component mounting machine except for the electronic component mounting machine at the head (furthest upstream) of the multiple electronic component mounting machines may acquire information of the electronic components already mounted on the circuit board 13 loaded from the electronic component mounting machine on the upstream side from the upstream electronic component mounting machine, a production line management computer (not shown), or the like, add the total weight of the already mounted electronic components to the weight of the circuit board 13, and control the clamping force of board clamp device 10 in accordance with the total weight of the board and the components. In this way, even if the total weight of the circuit board 13 to be clamped becomes heavier to some extent due to the total weight of the mounted electronic components, the circuit board 13 can be clamped with an appropriate clamping force in accordance with the combined weight of the circuit board 13 and the mounted electronic components.

Also, as a parameter for controlling the clamping force, the board information is not limited to the weight of the circuit board 13, or the total weight of the already mounted electronic components, but may include the material of the circuit board 13. For example, control may be performed such that the clamping force is smaller as the material of the circuit board is more susceptible to cracking or damage. Accordingly, even if the material of the circuit board 13 to be clamped is susceptible to cracking or damage, cracking or damage of the circuit board 13 due to the clamping operation can be prevented as much as possible.

Also, there are several methods for control device 31 of the electronic component mounting machine to acquire the board information, for example, the board information may be registered in a production program executed by the electronic component mounting machine, and control device 31 of the electronic component mounting machine may acquire the board information from the production program.

Alternatively, the circuit board 13 may be provided with a board information recording section in which board information is recorded or stored, a board information reading section configured to read the board information from the board information recording section of the circuit board, and control device 31 of the electronic component mounting machine may acquire circuit board information read by the board information reading section from the board information recording section of the circuit board 13. Here, as the board information recording section of circuit board 13, for example, a code label in which board information is recorded by barcode, two-dimensional code, or the like may be used, or an electronic tag (also called an RF tag, IC tag, radio tag, wireless) in which board information is stored may be used. If the board information recording section of circuit board 13 is a code label such as a barcode or a two-dimensional code, the board information reading section may be a code reader for reading a code by optical scanning, or mark imaging camera 34 may be used as the board information reading section such that the circuit board information recording section of the circuit board 13 is imaged by mark imaging camera 34, and the image is processed by control device 31 to read the board information. Further, if the board information recording section of circuit board 13 is an electronic tag, the board information reading section may be a reader for reading board information stored in the electronic tag via wireless communication.

The board information reading section may be installed in each of the multiple electronic component mounting machines constituting the production line, or may be installed outside the electronic component mounting machine, for example, at the furthest upstream of the production line, and the board information reading section further upstream in the production line may read the board information of the circuit board 13 loaded to the production line, and that board information may be transmitted to each electronic component mounting machine of the production line. Alternatively, the board information may be transmitted from a production line management computer to control device 31 of the electronic component mounting machine.

Further, control device 31 of the electronic component mounting machine may be configured to control the clamping force to a clamping force set based on the board information from the beginning of the clamping operation of board clamp device 10, or may perform the clamping operation with a predetermined clamping force larger than the clamping force set based on the board information until the clamping operation of board clamp device 10 is completed, and may switch the clamping force of board clamp device 10 to the clamping force set based on the board information after the clamping operation is completed to maintain the clamping state. In this case, the clamping force at the start of the clamping operation may be a predetermined fixed clamping force, or may be set to be greater by a predetermined quantity or a predetermined percentage than the clamping force after the completion of the clamping operation set based on the board information, that is, the clamping force at the start of the clamping operation may be greater than the clamping force after the completion of the clamping operation. In this manner, if the clamping operation is started with a relatively large clamping force from the beginning of the clamping operation, the clamping operation rate at which the side edge sections of circuit board 13 are lifted by clamp member 21 from below can be increased, and productivity can be improved.

Note that, as a method of mounting electronic components on circuit board 13, in addition to a method of soldering or wire bonding the terminals of the electronic component to the lands on the surface of circuit board 13, there is insertion or press-fit mounting (also called through-hole mounting) in which terminals such as the leads of the electronic component are inserted or pressed into holes of the circuit board 13 so as to mount the electronic component on the circuit board 13. With such insertion or press-fit mounting, when a terminal such as a lead of an electronic component is inserted or pressed into a hole of circuit board 13, the load of the insertion or pressing acts as a load for pushing down the circuit board 13, therefore, if the load of the insertion or pressing increases, a clamping force for fixing the circuit board 13 may be insufficient and the circuit board 13 may be displaced.

As a countermeasure to this, in the present embodiment, control device 31 of the electronic component mounting machine acquires information of the electronic components to be mounted on circuit board 13 from the production program or the production line management computer, determines whether the electronic component is an insertion or press-fit component having terminals or protrusions to be inserted or pressed into holes of the circuit board 13, and if the electronic component is the insertion or press-fit component, control device 31 is configured to control the clamping force of board clamp device 10 considering, in addition to the board information, a load when the terminal or the protrusion of the electronic component is inserted or pressed into the hole of the circuit board 13. This makes it possible to clamp the circuit board 13 with an appropriate clamping force corresponding to the combined weight of the weight of the circuit board 13 and the load of the insertion or pressing even when the load of the insertion or pressing is applied to the circuit board 13 during insertion or press-fit mounting, thereby preventing positional deviation of the circuit board 13 due to insertion or press-fit mounting. The method for determining the insertion or pressing load may be that of memorizing in advance in memory device 37 a table set with insertion or pressing loads for each type of insertion or press-fit component, referring to the table, and reading the insertion or pressing load in accordance with the type of the insertion or press-fit component.

Alternatively, control device 31 of the electronic component mounting machine may be configured to determine whether there is an insertion or pressing process for inserting or press-fitting a terminal or a protrusion of the electronic component to be mounted on the circuit board 13 into a hole of the circuit board 13 based on a production program executed by the electronic component mounting machine, and if there is the insertion or pressing process, control device 31 may be configured to control the clamping force of board clamp device 10 considering, in addition to the board information, a load when the terminal or the protrusion of the electronic component is inserted or pressed into the hole of the circuit board 13.

Note that, when an insertion or press-fit component is included in the electronic components to be mounted on circuit board 13, the clamping force may be controlled to be the same as the clamping force (clamping force considering the load of insertion or pressing) when mounting the insertion or press-fit component, even when mounting an electronic component which is not an insertion or press-fit component, but the clamping force may be controlled by considering the insertion or pressing load only when mounting insertion or press-fit components, and when mounting an electronic component which is not an insertion or press-fit component, the clamping force may be controlled by switching to a clamping force not considering the insertion or pressing load. In this manner, when an electronic component, which is not an insertion or press-fit component, is mounted, the clamping force can be reduced, and the power consumed by the driving motor of raising and lowering device 17, which is the drive source of board clamp device 10, can be reduced accordingly.

Also, in the present embodiment, the information of the clamping force controlled by control device 31 of the electronic component mounting machine may be registered as traceability information in a production management database (production line management computer) in association with identification information of the circuit board 13. In this way, if any defect (for example, cracking, or damage to the circuit board 13, deviation of the component mounting position, and the like) occurs in a produced electronic component mounting board, traceability information regarding the electronic component mounting board in which the defect occurred can be read from the production management database, and the clamping force when the electronic component mounting board was clamped can be investigated, and it can be checked whether the cause of the defect was excessive or insufficient clamping force.

According to an embodiment describe above, with control device 31 of the electronic component mounting machine, since the board information including at least the weight of the circuit board 13 is acquired and the clamping force of board clamp device 10 is controlled based on the board information, for example, when the weight of the circuit board 13 is light, the clamping force of board clamp device 10 is reduced in accordance with the light weight, and when the weight of the circuit board 13 is heavy, the clamping force of board clamp device 10 is increased in accordance with the heavy weight. As a result, when a large number of circuit boards lighter than the heaviest assumed circuit board are clamped, the clamping force of board clamp device 10 can be reduced in accordance with the weight of the circuit boards, the circuit boards can be prevented from being cracked or damaged by the clamping operation, the power consumed by the driving motor of raising and lowering 17 that is the drive source of board clamp device 10 can be reduced, and energy saving can be realized. Moreover, when a large number of circuit boards lighter than the heaviest assumed circuit board are clamped, the clamping force acting on conveyor 12 can be reduced, such that the quantity and duration of the maximum clamping force acting on conveyor 12 can be greatly reduced, thereby relaxing the design criteria for the mechanical strength and durability of conveyor 12, thus reducing manufacturing costs.

It is needless to say that the present disclosure is not limited to the above embodiments, and various modifications may be implemented within a range that does not deviate from the gist of the disclosure, such as, for example, the quantity of conveyors 12 installed in an electronic component mounting machine may be multiple, or the configurations of board clamp device 10 and conveyor 12 may be appropriately modified.

REFERENCE SIGNS LIST

10: board clamp device;
11: component mounting station;
12: conveyor;
12a: conveyor belt;
13: circuit board;
14: side frame;
15: backup pin;
16: backup plate;
17: raising and lowering device;
21: clamp member;
22: conveyor rail;
31: control device;
34: mark imaging camera

The invention claimed is:

1. An electronic component mounting machine comprising:
   a board clamp device configured to clamp a circuit board conveyed by a conveyor by sandwiching side edge sections of the circuit board between a clamp member from below and a conveyor rail from above by raising the clamp member, the electronic component mounting machine being configured to mount electronic components on the circuit board clamped by the board clamp device, the board clamp device including
      a backup plate on which a backup pin is loaded,
      a raising and lowering device which vertically moves the backup plate,
      the clamp member, and
      a support member which attaches the clamp member to the backup plate; and
   a control device configured by a computer, the control device configured to control a clamping force that is a sandwiching force on the side edge sections of the circuit board sandwiched between the clamp member and the conveyor rail of the board clamp device, the control device being configured to
      acquire board information, the board information including a weight of the circuit board, and
      control a driving motor of the raising and lowering device so as to control the clamping force of the board clamp device based on the weight of the circuit board included in the board information and a predetermined relationship between the weight of the circuit board and the clamping force, the clamping force decreasing as the weight of the circuit board decreases.

2. The electronic component mounting machine according to claim 1, wherein
the board information includes a total weight of the electronic components mounted on the circuit board, and the control device is configured to control the clamping force of the board clamp device based on the total weight of the electronic components mounted on the circuit board and the weight of the circuit board.

3. The electronic component mounting machine according to claim 1, wherein the board information includes a material of the circuit board.

4. The electronic component mounting machine according to claim 3, wherein
the control device is configured to control the clamping force of the board clamp device based on the material of the circuit board.

5. The electronic component mounting machine according to claim 1, wherein
the board information is registered in a production program executed by the electronic component mounting machine, and the control device is configured to acquire the board information from the production program.

6. The circuit board mounting machine according to claim 1, wherein
the circuit board is provided with a board information recording section configured to record or store the board information,
the control device includes a board information reading section configured to read the board information from the board information recording section of the circuit board, and
the control device is configured to acquire the board information read by the board information reading section from the circuit board information recording section of the circuit board.

7. The electronic component mounting machine according to claim 1, wherein
the control device is configured to control the board clamp device to perform a clamping operation with a predetermined clamping force larger than the clamping force set based on the board information until the clamping operation of the board clamp device is completed, and to switch the clamping force of the board clamp device to the clamping force set based on the board information to maintain a clamping state after the clamping operation is completed.

8. The electronic component mounting machine according to claim 1, wherein
the control device is configured to control the clamping force of the board clamp device based on a load provided by a mounting head inserting or pressing terminals or protrusions of the electronic components into holes of the circuit board.

9. The electronic component mounting machine according to claim 8, wherein
the control device is configured to
acquire information of the electronic components to be mounted on the circuit board,
determine whether the electronic components are an insertion or press-fit component having terminals or protrusions to be inserted or pressed into holes of the circuit board, and
when the electronic component is the insertion or press-fit component, control the clamping force of the board clamp device based on the load provided by the mounting head when the terminals or the protrusions of the electronic components are inserted or pressed into the holes of the circuit board.

10. The electronic component mounting machine according to claim 8, wherein
the control device is configured to
determine whether there is an insertion or pressing process for inserting or press-fitting a terminal or a protrusion of the electronic component to be mounted on the circuit board into a hole of the circuit board based on a production program executed by the electronic component mounting machine, and
when there is the insertion or pressing process, control the clamping force of the board clamp device based on the load provided by the mounting head when the terminal or the protrusion of the electronic component is inserted or pressed into the hole of the circuit board.

11. The electronic component mounting machine according to claim 1, wherein
the control device is configured to register information of the controlled clamping force as traceability information in a production management database in association with identification information of the circuit board.

* * * * *